United States Patent
Rowley (10) Patent No.: US 9,100,010 B2
(45) Date of Patent: Aug. 4, 2015

(54) CASCODED H-BRIDGE PRE-DRIVER

(71) Applicant: Texas Instruments Incorporated, Dallas, TX (US)

(72) Inventor: Matthew D Rowley, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/967,303

(22) Filed: Aug. 14, 2013

(65) Prior Publication Data

US 2015/0048866 A1    Feb. 19, 2015

(51) Int. Cl.
| | |
|---|---|
| H03K 3/00 | (2006.01) |
| H03K 17/56 | (2006.01) |
| H03K 17/10 | (2006.01) |
| G11B 5/02 | (2006.01) |
| H02P 7/00 | (2006.01) |

(52) U.S. Cl.
CPC .............. *H03K 17/102* (2013.01); *G11B 5/022* (2013.01); *H02P 7/0044* (2013.01)

(58) Field of Classification Search
CPC ..... G11B 5/022; H02P 7/0044; H03K 17/102
USPC .......................................... 327/110, 423, 588
See application file for complete search history.

(56) References Cited

U.S. PATENT DOCUMENTS

| | | | |
|---|---|---|---|
| 6,504,666 B1 * | 1/2003 | Patti et al. | 360/68 |
| 7,602,228 B2 * | 10/2009 | Mazzola et al. | 327/423 |
| 7,855,524 B2 * | 12/2010 | Pummer | 318/438 |
| 7,956,642 B2 * | 6/2011 | Lee | 326/68 |
| 7,982,500 B2 * | 7/2011 | Luich | 326/81 |
| 8,018,266 B2 * | 9/2011 | Chan | 327/333 |
| 8,629,707 B1 * | 1/2014 | Sanchez et al. | 327/333 |

* cited by examiner

*Primary Examiner* — Kenneth B Wells
(74) *Attorney, Agent, or Firm* — John R. Pessetto; Charles A. Brill; Frank D. Cimino (57) ABSTRACT

An aspect of the present invention includes a circuit having a cascoded H-bridge, an upper voltage supply component, a lower voltage supply component and a pre-driver component. The cascoded H-bridge is arranged to provide a driving signal for driving a load. The upper voltage supply component can provide an upper supply voltage to the cascoded H-bridge. The lower voltage supply component can provide a lower supply voltage to the cascoded H-bridge. The pre-driver component can provide a pre-driving signal to the cascoded H-bridge, wherein pre-driver component has a first voltage source and a second voltage source. The first voltage source can provide an upper swing voltage and the second voltage source can provide a lower swing voltage. The pre-driver component can provide the pre-driving signal based on the upper swing voltage, the lower swing voltage and one of the upper supply voltage and the lower supply voltage.

4 Claims, 10 Drawing Sheets

CASCODED H-BRIDGE PRE-DRIVER

BACKGROUND

The present invention generally relates to H-bridge transmitters.

Figure 1:
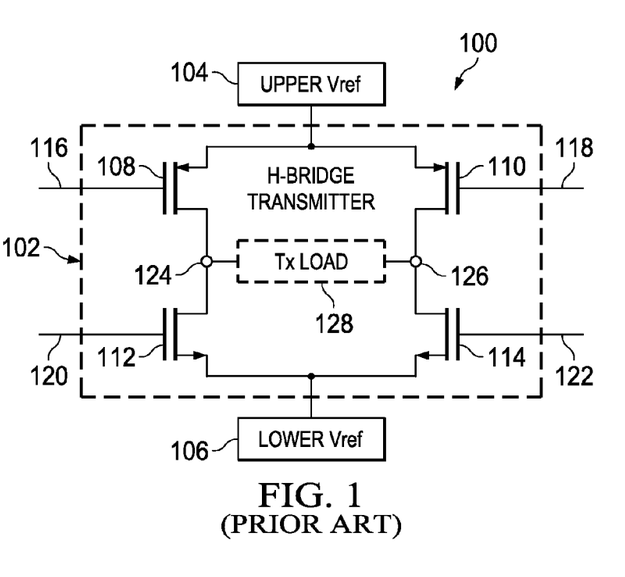
FIG. 1 illustrates a conventional H-bridge transmitter for driving DC electric motors.

FIG. 1 shows a conventional H-bridge transmitter. While H-bridge transmitters can be used in a plurality of driver applications, H-bridge operation is explained below using a low voltage DC electric motor application.

In the figure, conventional H-bridge transmitter 100 includes an H-bridge 102, an upper reference voltage source 104 and a lower reference voltage source 106. H-bridge 102 includes a Field Effect Transistor (FET) 108, a FET 110, a FET 112 and a FET 114. FET 108 is an NMOS FET, FET 110 is an NMOS FET, FET 112 is a PMOS FET and FET 114 is a PMOS FET.

As shown in the figure, FET 108 is arranged to be the upper left leg of H-bridge 102, whereas FET 110 is arranged to be the upper right leg of H-bridge 102. FET 112 is arranged to be the lower left leg of H-bridge 102, whereas FET 114 is arranged to be the lower right leg of H-bridge 102.

An input signal 116 drives the gate FET 108 and an input signal 118 drives the gate of FET 110. An input signal 120 drives the gate of FET 112 and an input signal 122 drives the gate FET 114. An output terminal 124 and an output terminal 126 are arranged as the transmitter outputs of H-bridge 102. A transmission load 128, as applied across output terminal 124 and output terminal 126, represents the load which H-bridge transmitter 100 drives.

Upper reference voltage source 104 and a lower reference voltage source 106 set the voltage swing limits between output terminals 124 and 126, and thus to transmission load 128. The signal amplitude and polarity across transmission load 128 is set by input signals 116, 118, 120 and 122.

For purposes of discussion, consider the operation of H-bridge 102 for a conventional basic low voltage DC motor control. In a first state, input signals 116 and 122 actuate the gates of FETs 108 and 114, respectively, whereas input signals 118 and 120 do not actuate the gates of FETs 110 and 112, respectively. In this first state, the current would run from output terminal 124 through transmission load 128 to output terminal 126, such that the motor would turn in a first direction. In a second state, input signals 116 and 122 do not actuate the gates of FETs 108 and 114, respectively, whereas input signals 118 and 120 actuate the gates of FETs 110 and 112, respectively. In this second state, the current would run from output terminal 126 through transmission load 128 to output terminal 124, such that the motor would turn in a second direction, opposite ID the first direction.

However, for high DC voltage applications, the CMOS based H-bridge implementation described above presents a challenge in supporting the necessary voltage swings without transistor damage.

What is needed is an H-bridge transmitter utilizing CMOS logic, but where the design supports the output drive voltages conventionally supported only by the conventional higher voltage semiconductor technologies such as bipolar.

BRIEF SUMMARY

Aspects of the present invention enable an H-bridge transmitter utilizing CMOS logic, but where the design supports the output drive voltages conventionally supported only try the conventional higher voltage semiconductor technologies such as bipolar. Aspects of the present invention can support a plurality of high voltage applications, a non-limiting example of which is as a driver for a Hard Disk Drive (HDD) read/write head.

An aspect of the present invention includes a circuit having a cascoded H-bridge, an upper voltage supply component, a lower voltage supply component and a pre-driver component. The cascoded H-bridge is arranged to provide a driving signal for driving a load. The upper voltage supply component can provide an upper supply voltage to the cascoded H-bridge. The lower voltage supply component can provide a lower supply voltage to the cascoded H-bridge. The pre-driver component can provide a pre-driving signal to the cascoded H-bridge, wherein pre-driver component has a first voltage source and a second voltage source. The first voltage source can provide an upper swing voltage and the second voltage source can provide a lower swing voltage. The pre-driver component can provide the pre-driving signal based on the upper swing voltage and the lower swing voltage.

Additional advantages and novel features of the invention are set forth in part in the description which follows, and in part will become apparent to those skilled in the art upon examination of the following or may be learned by practice of the invention. The advantages of the invention may be realized mid attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIG. 5 illustrates the portion of FIG. 5 which represents the output buffer functions;

DETAILED DESCRIPTION

The present invention provides a high power implementation in CMOS logic of an H-bridge transmitter.

Aspects of the present invention provide an H-bridge transmitter that includes cascoded CMOS FET transistors, source-follower voltage references and pre-drivers to drive the H-bridge transistor gates. Compared with the conventional use of bipolar technology for high voltage drive circuits and CMOS for accompanying logic circuits, large gains in ease of fabrication and cost effectiveness are achieved when both are implemented in CMOS and aspects of the present invention allow this. An H-bridge transmitter in accordance with aspects of the present invention can be used in a variety of higher voltage applications. One non-limiting example is as a driver for HDD read/write head since HDDs also may use low voltage logic circuits to manipulate data for storage. Overvoltage protection of the CMOS transistors in the high voltage setting is achieved through the use of transistor cascoding. Cascoding of transistors requires tight control of internal voltage swings and scaled cascode voltages in order to maintain efficient functional operation. This is achieved through the use of the pre-drivers and source-follower voltage references. The pre-drivers also allow for tailoring of the design to different customer load requirements.

An H-bridge transmitter implementation employing cascoded CMOS FETs for the applications such as HDD drive circuits has several challenges. To meet the required performance for the applications there may be tight control over the voltage references, which set the voltage swing limits and the scaled levels of the cascoded switches. The upper and lower swing limits for the output may be set via a battery reference rather than the use of more general current sources. Further, switch levels may be set to correspond to those swing limits in order to maintain efficiency and functional operation. Also, cascode voltage swing limits may be set to correspond to the appropriate scaled voltage relative to the switch voltage levels and each switch not only may be functionally independent but may enable and disable completely when switching.

Through the use of pre-drivers and source follower voltage references, aspects of the present invention successfully address and overcome all the challenges listed above.

Aspects of the present invention will now be explained in detail with reference to FIGS. 2-10.

Figure 2:
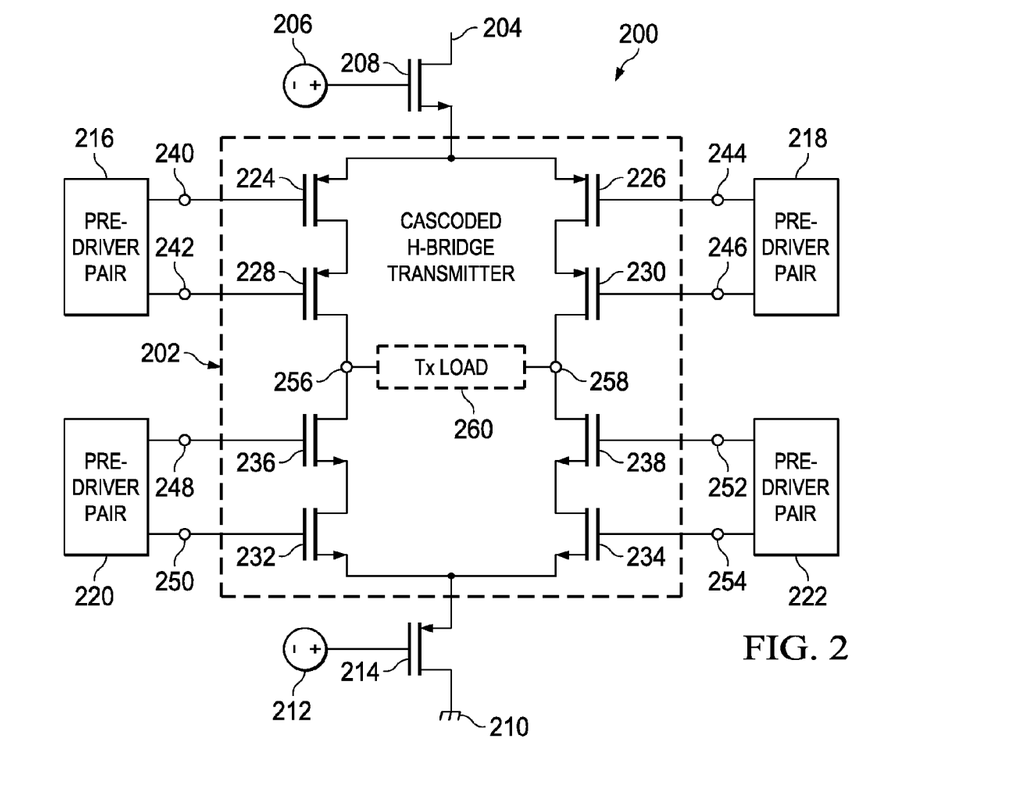
FIG. 2 illustrates an H-bridge transmitter using cascoded. CMOS FET transistors and transistor gate pre-drivers suitable for HDD applications including high voltage applications.

FIG. 2 illustrates an H-bridge transmitter similar to the H-bridge described in FIG. 1 but using cascoded CMOS FET transistors and transistor gate pre-drivers suitable for high voltage applications including HDD applications.

As shown in the figure, system 200 includes a cascoded H-bridge transmitter 202, a supply voltage 204, a voltage reference 206, a FET 208, ground 210, a voltage reference 212, a FET 214, a pre-driver pair 216, a pre-driver pair 218, a pre-driver pair 220 and a pre-driver pair 222. FET 208 is NMOS FET and FET 214 is a PMOS FET.

Cascoded H-bridge transmitter 202 includes a switch FET 224, a switch FET 226, a cascode FET 228, a cascode FET 230, a switch FET 232, a switch FET 234, a cascode FET 236, a cascode FET 238 and a transmission load 260. FETs 224, 226, 228 and 230 are PMOS FETs, whereas FETs 232, 234, 236 and 238 are NMOS FETs.

Voltage reference 206 and FET 208 are arranged as a source-follower-based upper voltage reference relative to supply voltage 204. Voltage reference 212 and FET 214 are arranged as a source-follower-based lower voltage reference relative to ground 210.

Switch FET 224 and cascode FET 228 are arranged as the upper left leg of cascaded H-bridge transmitter 202, whereas switch FET 226 and cascode FET 230 are arranged as the upper right leg of cascaded H-bridge transmitter 202. Switch FET 232 and cascade FET 236 are arranged as the lower left leg of cascaded H-bridge transmitter 202, whereas switch FET 234 and cascade FET 238 are arranged as the lower right leg of cascaded H-bridge transmitter 202. An output terminal 256 and an output terminal 258 are arranged as the outputs of cascaded H-bridge transmitter 202. Transmission load 260, as applied across output terminal 256 and output terminal 258, represents the load that cascaded H-bridge transmitter 202 drives.

Pre-driver 216 is arranged to drive the gates of switch FET 224 and cascade FET 228 via a terminal 240 and a terminal 242, respectively. Pre-driver 218 is arranged to drive the gates of switch FET 226 and cascade FET 230 via a terminal 244 and a terminal 246, respectively. Pre-driver 220 is arranged to drive the gates switch FET 232 and cascade FET 236 via a terminal 250 and a terminal 248, respectively. Pre-driver 222 is arranged to drive the gates switch FIT 234 and cascade FET 238 via a terminal 254 and a terminal 252, respectively.

Each of voltage reference 206 and voltage reference 212 are adjustable. Adjustment of voltage reference 206 and voltage reference 212 sets the maximum voltage swing of the output of cascaded H-bridge transmitter 202 between the limits set by supply voltage 204 and ground 210. The ability to handle high output voltage swings is achieved by sharing of the total voltage swings between multiple CMOS FET transistors, hence the cascading arrangement. Each transistor handles only its own portion of the total H-bridge voltage swing, wherein the voltage swings of each transistor are individually set by the pre-drivers. For example, pre-driver 216 sets the operating voltage swings of switch FET 224 and cascode FET 228. Similarly, the other legs' switch and cascade FETs voltage swings are set by their respective pre-drivers.

For purposes of discussion, consider the operation of cascaded H-bridge transmitter 202 for a conventional bask DC motor control. In a first state, input signals at terminals 240 and 242 actuate the gates of switch FET 224 and cascade FET 228, respectively, and input signals at terminals 254 and 252 actuate the gates of switch FET 234 and cascade FET 238, respectively, whereas input signals at terminals 244 and 246 do not actuate the gates of switch FET 226 and cascade FET 230, respectively, and input signals at terminals 250 and 248 do not actuate the gates of switch FET 232 and cascade 236, respectively. In this first state, the current would run from output terminal 256 through transmission load 260 to output terminal 258, such that the motor would turn in a first direction, in a second state, input signals at terminals 240 and 242 do not actuate the gates of switch FET 224 and cascade FET 228, respectively, and input signals at terminals 254 and 252 do not actuate the gates of switch FET 234 and cascade FET 238, respectively, whereas input signals at terminals 244 and 246 actuate the gates of switch FET 226 and cascode FET 230, respectively, and input signals at terminals 250 and 248 actuate the gates of switch FET 232 and cascade 236, respectively. In this second state, the current would run from output terminal 258 through transmission load 260 to output terminal 256, such that the motor would turn in a second direction, opposite to the first direction.

Referring briefly to H-bridge 102 of FIG. 1, which is the conventional case, it should be noted that when comparing the operation of H-bridge 102 with the operation of cascoded H-bridge transmitter 202, each of the four legs of H-bridge 102 include only a single transistor whereas each of four legs of H-bridge transmitter H-bridge 202 include two transistors in a cascoded arrangement. For example, the upper left leg of H-bridge 102 includes FET 108, which is a switch transistor since there is no cascoding, whereas the upper left leg of cascoded H-bridge transmitter 202 includes both switch FET 224 and cascode FET 228. As described earlier, cascode FETs 228, 230, 236 and 238 not only provide a current path to transmission load 260 from switch FETs 224, 226, 232 and 234, respectively, but are also used to handle a portion of the maximum voltage swing that can appear at transmission load 260 which is the voltage between supply voltage 204 and ground 210. This leaves switch FETs 224, 226, 232 and 234 to handle only a portion of the maximum voltage swing compared to the switch FETs of H-bridge 102 of FIG. 1, FETs 108, 110, 112 and 114 which handle the entire voltage swing. Thus, in the case whereby the transistor breakdown voltage and the punch-through voltage of the FETs used for H-bridge 102 and for cascoded H-bridge transmitter 202 are the same, and cascoded H-bridge 202 is operating in accordance with aspects of the present invention, transmission load 260 can be a larger load than transmission load 128.

In comparing a conventional example of H-bridge 102 and an embodiment of H-bridge 202 in accordance with aspects of the present invention and in which the transistors of both are implemented in low-cost CMOS logic technology operating at 3.3 volts and in which the load of both is an HDD operating with the high control voltages required by current HDD technology, 12 volts for example, the H-bridge 102 may not be able to support the required voltages without damage to the transistors, whereas cascoded H-bridge transmitter 202 would be able support the required voltages without damage.

As explained heretofore and in accordance with the aspects of the present invention, cascoded H-bridge transmitter 202 uses pre-drivers to control the scaled voltages and voltage swings of the switch and cascade transistors. An example pre-driver, in accordance with aspects of the present invention will now be discussed in further detail with reference to FIG. 3.

Figure 3:
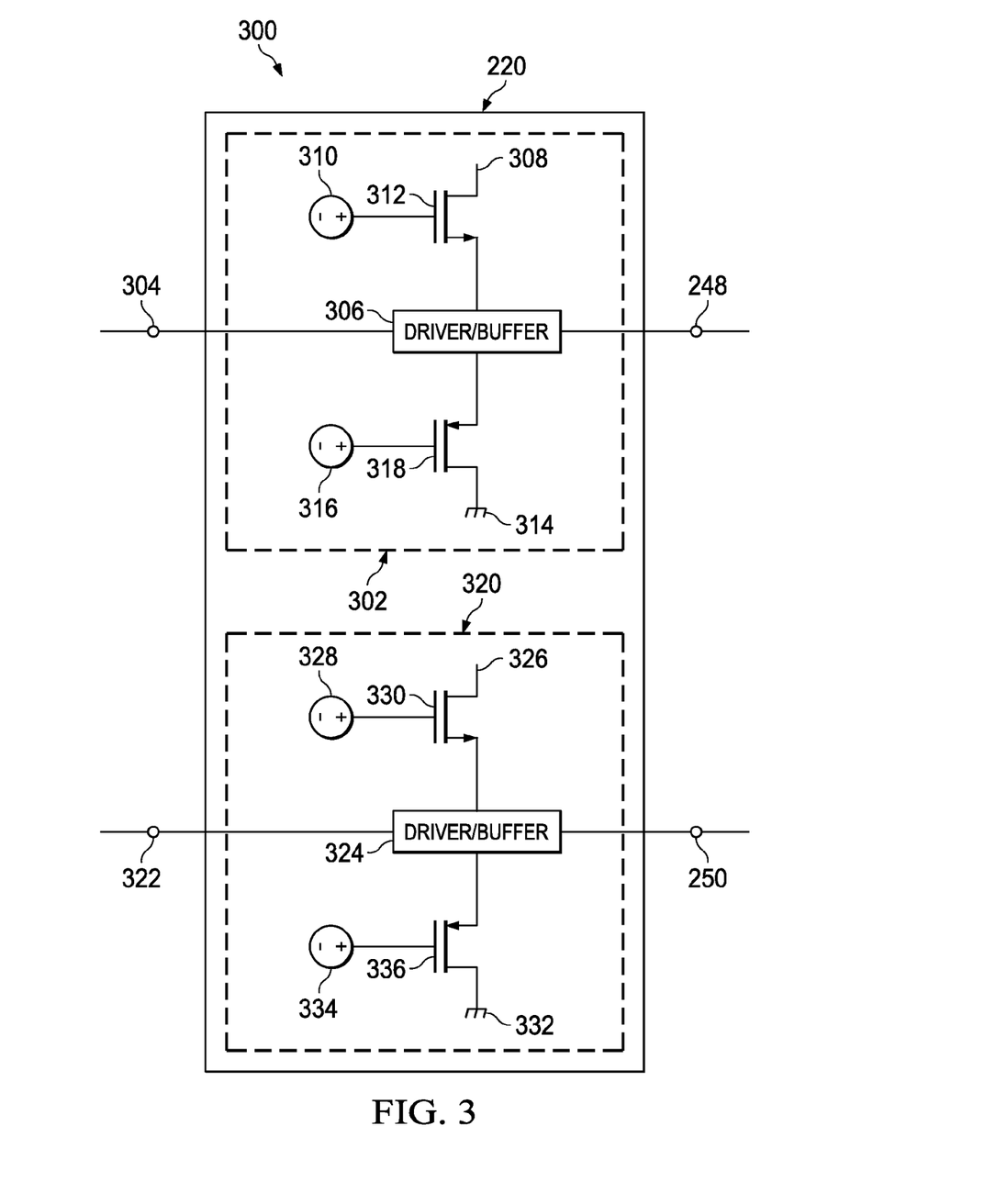
FIG. 3 illustrates the pre-driver for a switch/cascode transistor pair.

FIG. 3 illustrates an exploded view of an example pre-driver pair 220 of FIG. 2. The other three pre-drivers of the H-bridge may of the same design and will not be separately explained.

As shown in the figure, pre-driver pair 220 includes a pre-driver 302 and a pre-driver 320. Pre-driver 302 includes a driver/buffer 306, a supply voltage 308, a voltage reference 310, an NMOS FET 312, a ground 314, a voltage reference 316 and a PMOS FET 318. Pre-driver 320 includes a driver/buffer 324, a voltage reference 328, a NMOS FET 330, a ground 332, a voltage reference 334 and a PMOS FET 336.

A lower cascode logic input signal 304 is arranged to feed pre-driver 302, which outputs a lower cascode drive signal at terminal 248. Voltage reference 310 and NMOS FET 312 are arranged as a source follower upper voltage reference relative to supply voltage 308 for driver/buffer 306. Voltage reference 316 and PMOS FET 318 are arranged as a source follower lower voltage reference relative to ground 314 for driver/buffer 306.

A lower switch logic input signal 322 is arranged to feed pre-driver 320, which outputs a lower switch drive signal at terminal 250. Voltage reference 328 and NMOS FET 330 are arranged as a source follower upper voltage reference relative to supply voltage 326 for driver/buffer 320. Voltage reference 334 and PMOS FET 336 are arranged as a source follower lower voltage reference relative to ground 332 for driver/buffer 320.

The voltage swing of output at terminal 248 from pre-driver 302 is set by voltage references 310 and 316 between the limits of supply voltage 308 and ground 314. Similarly, the total voltage swing of terminal 250 from pre-driver 320 is set by voltage references 328 and 334 between the limits of supply voltage 326 and ground 332.

The voltage swings of the pre-drivers are thus floating with respect to a respective supply voltage and ground. For any given application, as pre-driver's voltage limits are set not only to protect the transistor it feeds from over-voltage conditions, but also in order to represent the portion of the H-bridge total voltage swing to be handled by the transistor.

Aspects of the invention have until this point been described at a system level. Using FIG. 4 through FIG. 8, an example implementation at the circuit level will be explained.

Figure 4:
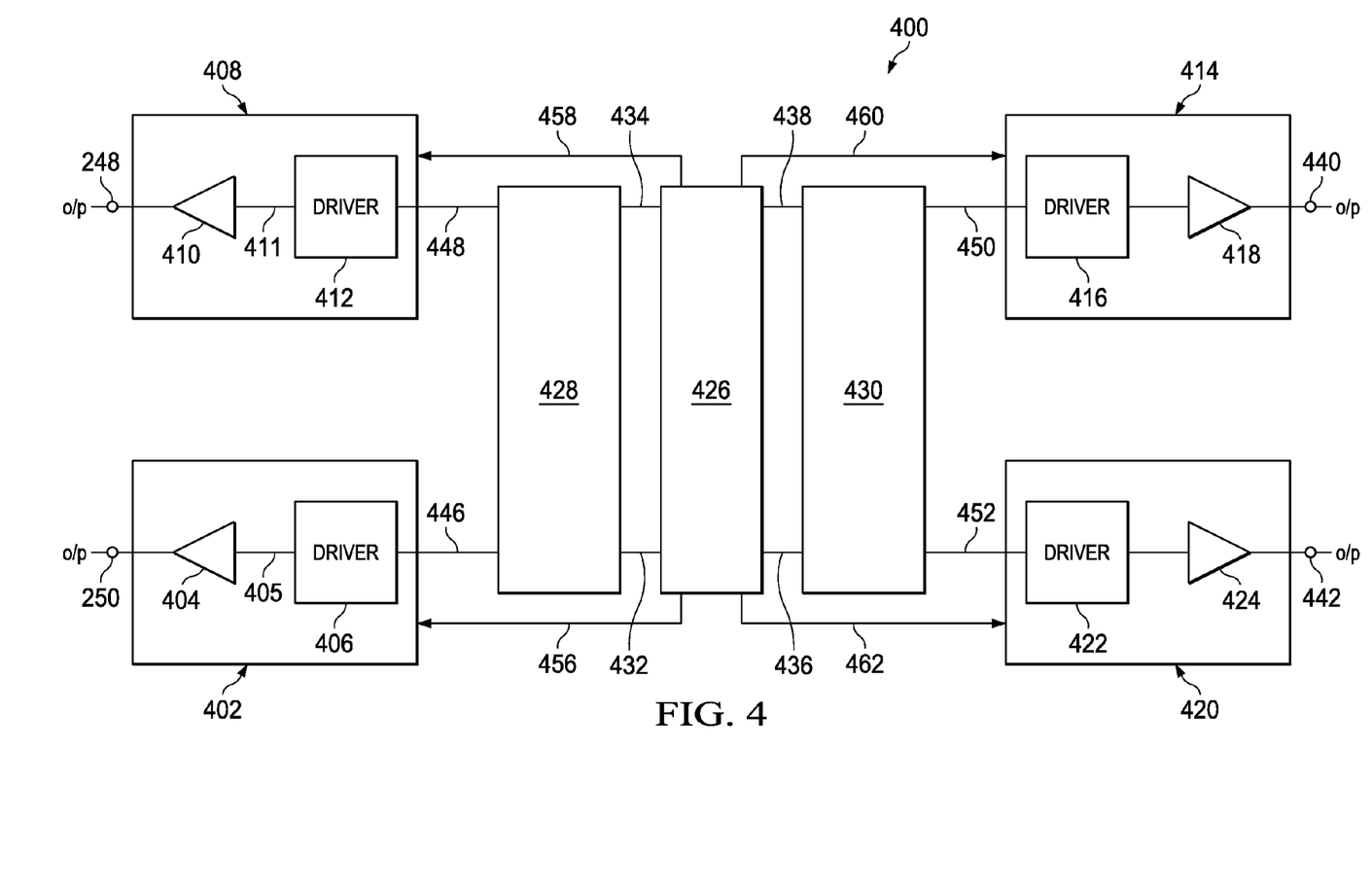
FIG. 4 is a component diagram illustrating the pre-driver circuit which implements aspects of the invention.

FIG. 4 shows a component representation of a circuit 400 in accordance with aspects of the present invention.

Circuit 400 represents the pre-drivers for driving the lower half of an H-bridge. The pre-drivers for driving the upper half of an H-bridge would be represented by an identical circuit. For purposes of brevity, the pre-drivers flat driving the upper half of an H-bridge will not be further explained at the circuit level.

In the figure, circuit 400 includes a pre-driver 402, a pre-driver 408, a pre-driver 414, a pre-driver 420, a voltage source component 426, an input buffer component 428 and an input buffer component 430. Pre-driver 402 includes an output buffer component 404 and a driver component 406. Pre-driver 408 includes an output buffer component 410 and a driver component 412. Pre-driver 414 includes an output buffer component 418 and a driver component 416. Pre-driver 420 includes an output buffer component 424 and a driver component 422.

Input buffer component 428 is arranged to receive an input signal 432 and output a drive signal 446 to pre-driver 402, and also to receive an input signal 434 and output a drive signal 448 to pre-driver 408. Input buffer component 430 is arranged to receive an input signal 436 and output a drive signal 452 to pre-driver 420, and also to receive an input signal 438 and output a drive signal 450 to pre-driver 414. Voltage source component 426 is arranged to provide voltage references to pre-drivers 402, 408, 414 and 420 via signals 456, 458, 460 and 462 respectively. Pre-driver 402 is arranged to output drive signal at terminal 250, pre-driver 408 is arranged to output drive signal at terminal 248, pre-driver 414 is arranged to output drive signal at terminal 252 and pre-driver 420 is arranged to output drive signal at terminal 254.

It should be noted that pre-drivers 402 and 408 correspond to pre-driver pair 220 of FIG. 2 and FIG. 3, with the voltage reference sources which provide the cascode and switch voltage swings contained in voltage source component 426. As such pre-driver 402 drives switch FET 232, whereas pre-driver 408 drives cascode FET 236. Similarly, pre-drivers 420 and 414 correspond to pre-driver pair 222 of FIG. 2, with the voltage reference sources which provide the cascode and switch voltage swings contained in voltage source component 426. As such, pre-driver 420 drives switch FET 234, whereas pre-driver 414 drives cascode FET 238.

Input data buffer component 428 provides electrical isolation between input signals 432 and 434, and pre-drivers 402 and 408, respectively. Input data buffer component 428 also provides the necessary additional power to input signals 432 and 434 in order for them to drive the circuits of pre-drivers 402 and 408, respectively. Similarly, input data buffer component 430 provides electrical isolation between input signals 436 and 438, and pre-drivers 420 and 414, respectively. Input data buffer component 430 also provides the necessary additional power to input signals 436 and 438 in order for them to drive the circuits of pre-drivers 420 and 414 respectively. With reference to system 200 of FIG. 2, the equivalent functions of input buffer components 428 and 430 of FIG. 4 an contained within pre-driver pairs 216, 218, 220 and 222. With respect to system 300 of FIG. 3 the equivalent functions of input buffer components 428 and 430 of FIG. 4 are contained within driver/buffer components 306 and 324. The input buffer functions are explained later in more detail in reference to FIG. 6.

Referring to FIG. 4, each of the pre-drivers 402, 408, 414 and 420 include a driver component and an output buffer component. For example, pre-driver 402 includes driver component 406 and output buffer component 404. Driver component 406 provides the voltage level shifting functions necessary to convert signal input 446 to digital logic levels which are then passed to output buffer component 404 via connection 405. Output buffer component 404 provides additional drive strength to digital logic levels arriving via connection 405 in order for pre-driver 402 to be able to drive large transistors. With reference to system 200 of FIG. 2 the equivalent functions of driver and input buffer components 404 and 406 of FIG. 4 respectively are performed within pre-driver pair 220. With reference to system 300 of FIG. 3 the equivalent functions of driver and input buffer components 404 and 406 respectively of FIG. 4 are performed within driver/buffer 324.

Figure 5:
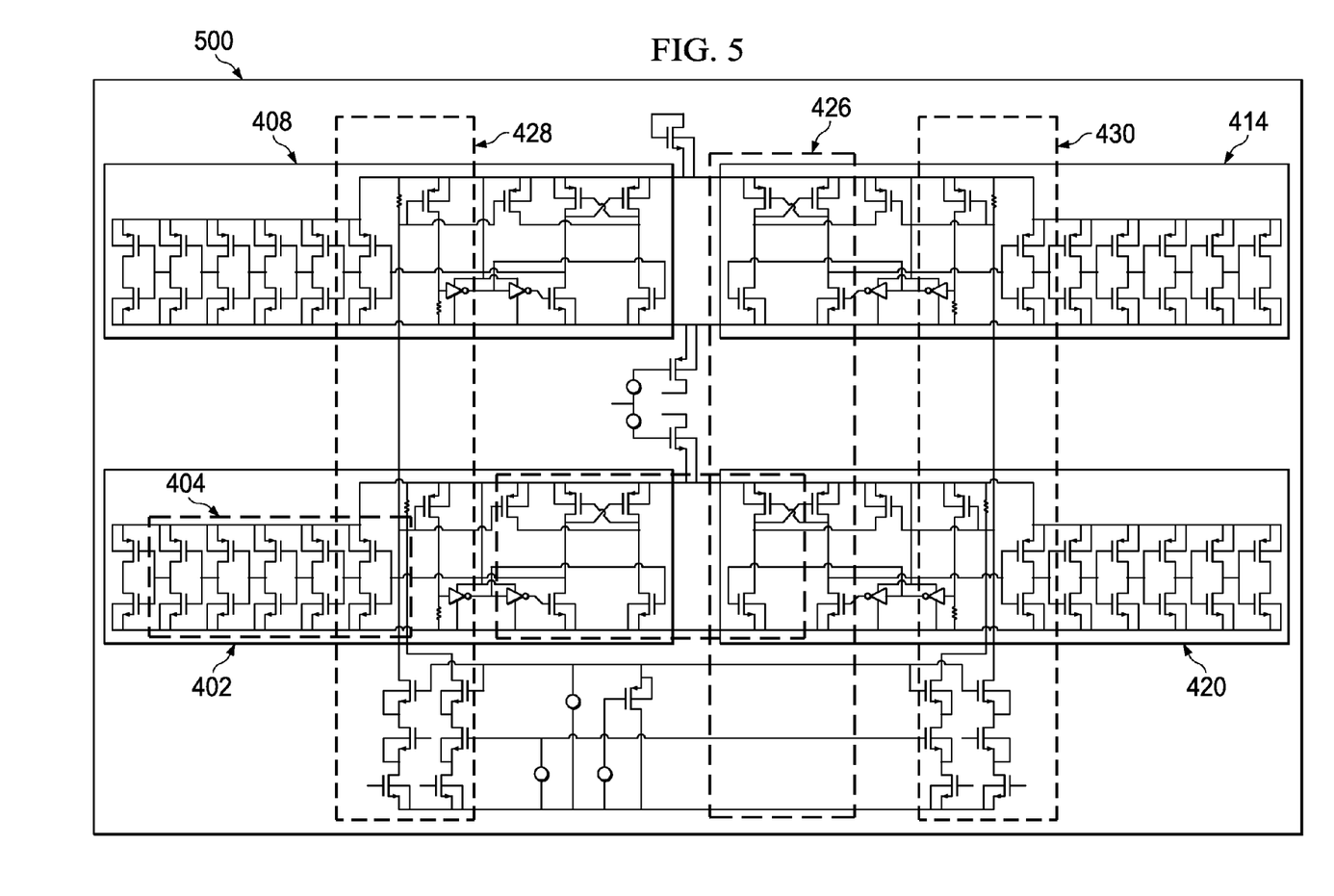
FIG. 5 is the circuit level representation of the component diagram of FIG. 4.

FIG. 5 illustrates an example circuit 500, a component level circuit which implements aspects of the present invention as related to the major components of component level circuit 400 of FIG. 4.

As shown in FIG. 5, circuit 500 includes pre-drivers 402, 408, 414 and 420, output buffer component 404, driver component 406, voltage source component 426, input buffer component 428 and input buffer component 430 of FIG. 4. Circuit 500 will be broken down into the individual components using FIGS. 6-8, to more easily explain the component level description.

Figure 6:
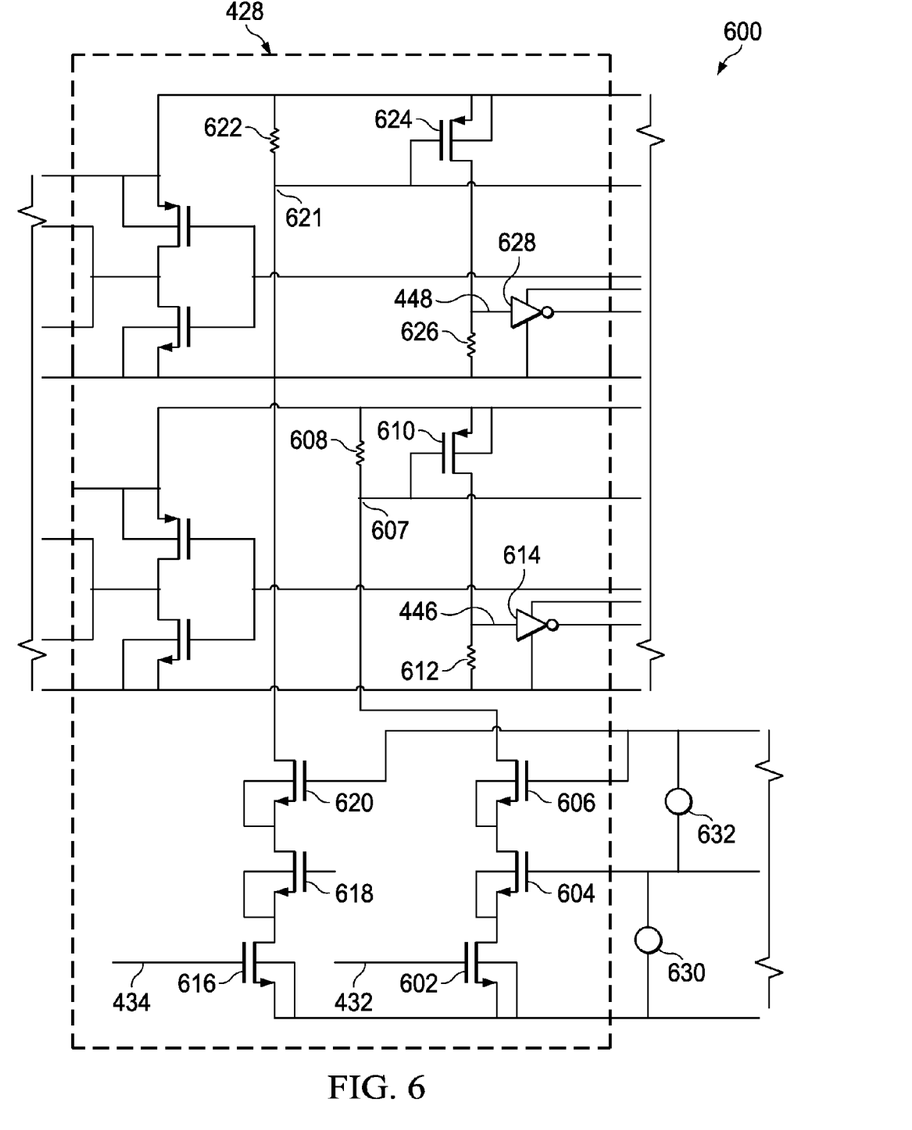
FIG. 6 illustrates the portion of FIG. 5 which represents the pre-driver input buffeting functions.

FIG. 6 shows diagram 600 illustrating the components of input buffer component 428 of FIGS. 4 and 5.

As shown in FIG. 6, input buffer component 428 includes a transistor 602, a transistor 604, a transistor 606, a resistor 608, a transistor 610 and a resistor 612. Buffer component 428 also includes a transistor 616, a transistor 618, a transistor 620, a resistor 622, a transistor 624, a resistor 626, a voltage source 630 and a voltage source 632. For purposes of clarity, FIG. 6 also shows inverter 614 which is part of driver component 406 of pre-driver 402 and inverter 628 which is part of driver component 412 of pre-driver 408. The operation of driver components 406 and 412 are explained later in more detail with reference to FIG. 7.

Input buffer component 428 serves both pre-driver 402 and pre-driver 408 and has an input and an output associated with each. Input signal 432 provided to transistor 602 and output signal 446 are associated with pre-driver 402. Output signal 446 is passed to driver component 406 of pre-driver 402 via inverter 614. Input signal 434 provided to transistor 616 and output signal 448 are associated with pre-driver 408. Output signal 448 is passed to driver component 412 of pre-driver 408 via inverter 628.

Transistors 602, 604 and 606 form a cascoded chain to buffer input signal 432 and to increase the amplitude of input signal 432 to produce signal 607. Resistor 608 sets the logic level at transistor 610. At this point, signal 607 has been set to span the voltage range between the voltage rails of driver component 406 of FIG. 4, the levels of which have been determined by voltage source component 426 of FIG. 4. This leaves driver component 406 able to convert to logic levels anywhere within this span. The setting of voltage rail voltages by voltage source component 426 will be described in more detail later with reference to FIG. 9. Transistor 610 mirrors the current at resistor 612. Resistor 612 sets the logic level for signal 446 where it enters driver component 406 at inverter 614.

Similarly, transistors 616, 618 and 620 form the cascoded buffer chain for the input signal 434. Resistor 622 sets the logic level at transistor 624 which mirrors the current at resistor 626. Resistor 626 sets the logic level for signal 448 where it enters driver component 412 at inverter 628.

Voltage source 630 and voltage source 632 set the cascade transistor voltage references for the first cascode stage transistors 604 and 618 and the second cascade stage transistors 606 and 620.

Having described signal paths through input buffer component 428 to the input of driver components 406 and 412, operation of driver components 406 will now be explained.

Figure 7:
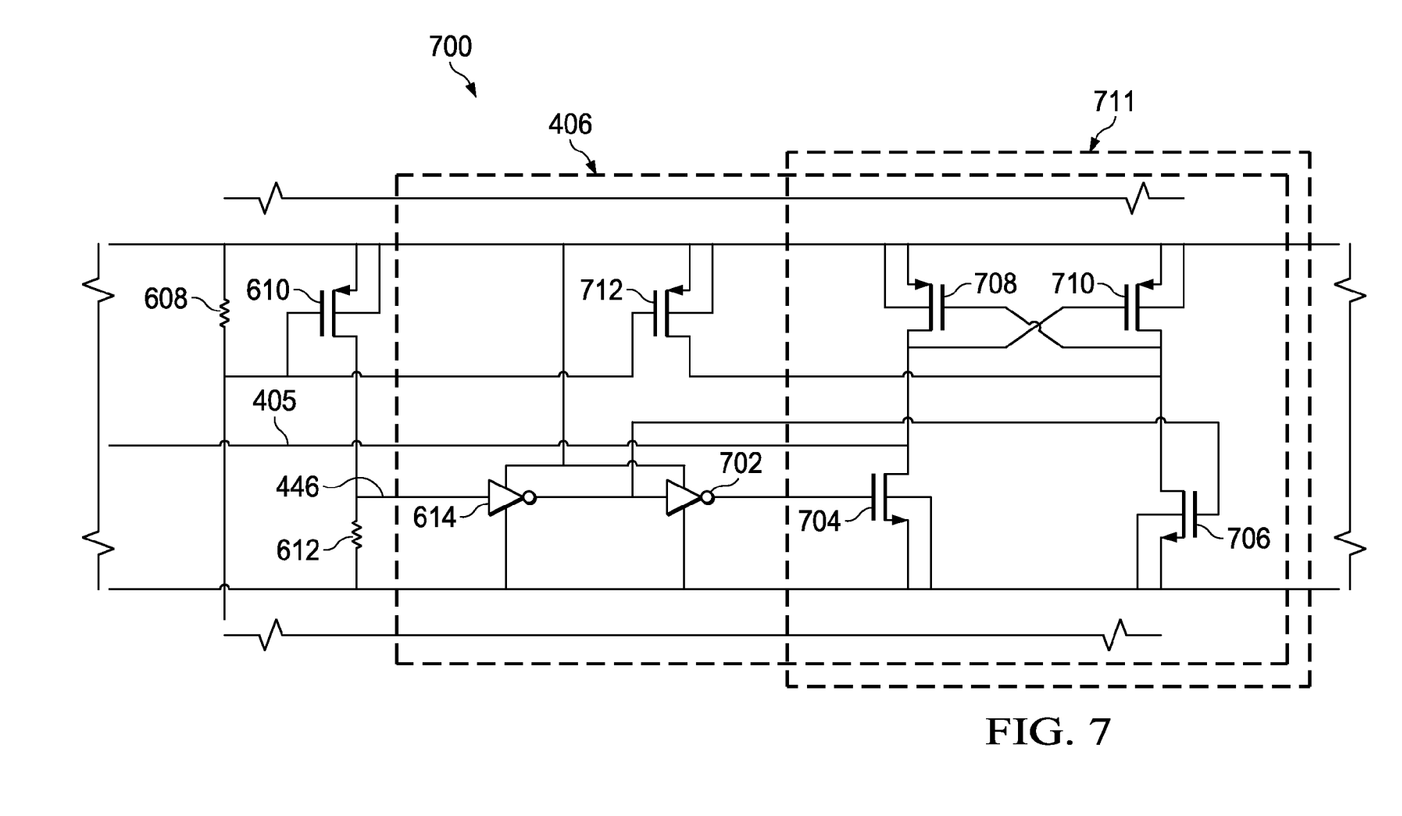
FIG. 7 illustrates the portion of FIG. 5 which represents the driver functions.

FIG. 7 illustrates the components of driver component 406 of FIG. 4 and FIG. 5. Other driver components, those of pre-drivers 408, 414 and 420 are identical. For purposes of brevity, the driver components of pre-drivers 412, 418 and 424 will not be separately explained.

As shown in FIG. 7, driver component 406 includes inverter 614, an inverter 702, a transistor 704, a transistor 706, a transistor 708, a transistor 710, and a transistor 712.

Driver component 406 receives signal 446 from input buffer component 402, and outputs signal 405.

Signal 446 is applied to inverters 614 and 702, which act as buffers. Transistors 704, 706, 708 and 710 form a level shifter 711, which serves to convert signal 446 to digital logic levels between a floating upper voltage reference and a floating lower voltage reference. For level shifter 711, inverter 614 drives transistor 706 and inverter 702 drives transistor 708. Level shifters being inherently slow due to their positive feedback, transistor 712 acts as a feed forward device to improve speed. Transistor 712 feeds past inverter 614 and inverter 702 into level shifter 711 and begins the switching process earlier than it would otherwise. Signal 405 is the output of level shifter 711 at the junction of transistors 704 and 708 and is the output of driver component 406.

The output of driver component 406 passes to output buffer component 404. Output buffer component 404 will be described next using FIG. 8.

Figure 8:
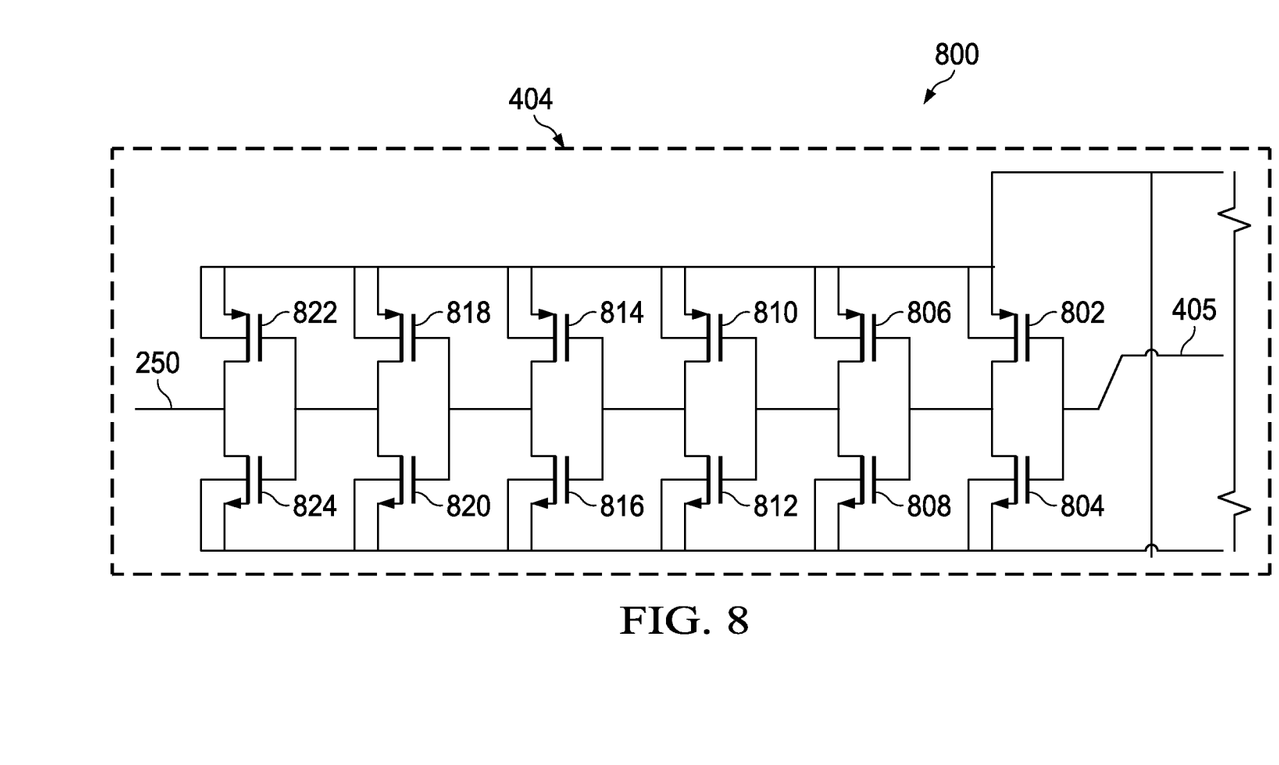

FIG. 8 shows diagram 800 illustrating the components of output buffer component 404 of pre-driver 402 of FIG. 4 and FIG. 5. Other output buffer components, those of pre-drivers 408, 414 and 420 are identical. For purposes of brevity, output buffer components of pre-drivers 408, 414 and 420 will not be separately explained.

As shown in FIG. 8, output buffer component 404 includes a transistor 802, a transistor 804, a transistor 806, a transistor 808, a transistor 810, a transistor 812, a transistor 814, a transistor 816, a transistor 818, a transistor 820, a transistor 822 and a transistor 824.

Transistors 802 and 804 are arranged together as an inverter. Similarly, transistors 806 and 808, 810 and 812, 814 and 816, 818 and 820, and 822 and 824, are all arranged as inverters for a total of six inverters.

The plurality of inverters are connected to form a buffer chain, the purpose of which is to increase the drive power of the pre-driver in order for it to have the capacity to drive any large transistors required by an H-bridge load. Cascading several CMOS inverters of increasing size is a well-known method to increase drive strength while still keeping input capacitance low and thus minimizing delay. The input to the buffer chain is signal 405, the output of the driver component 406 as previously described.

It should be noted that the output of the buffer chain and thus the output of buffer output component 404 is at terminal 250 of FIG. 2 and FIG. 3.

Figure 9:
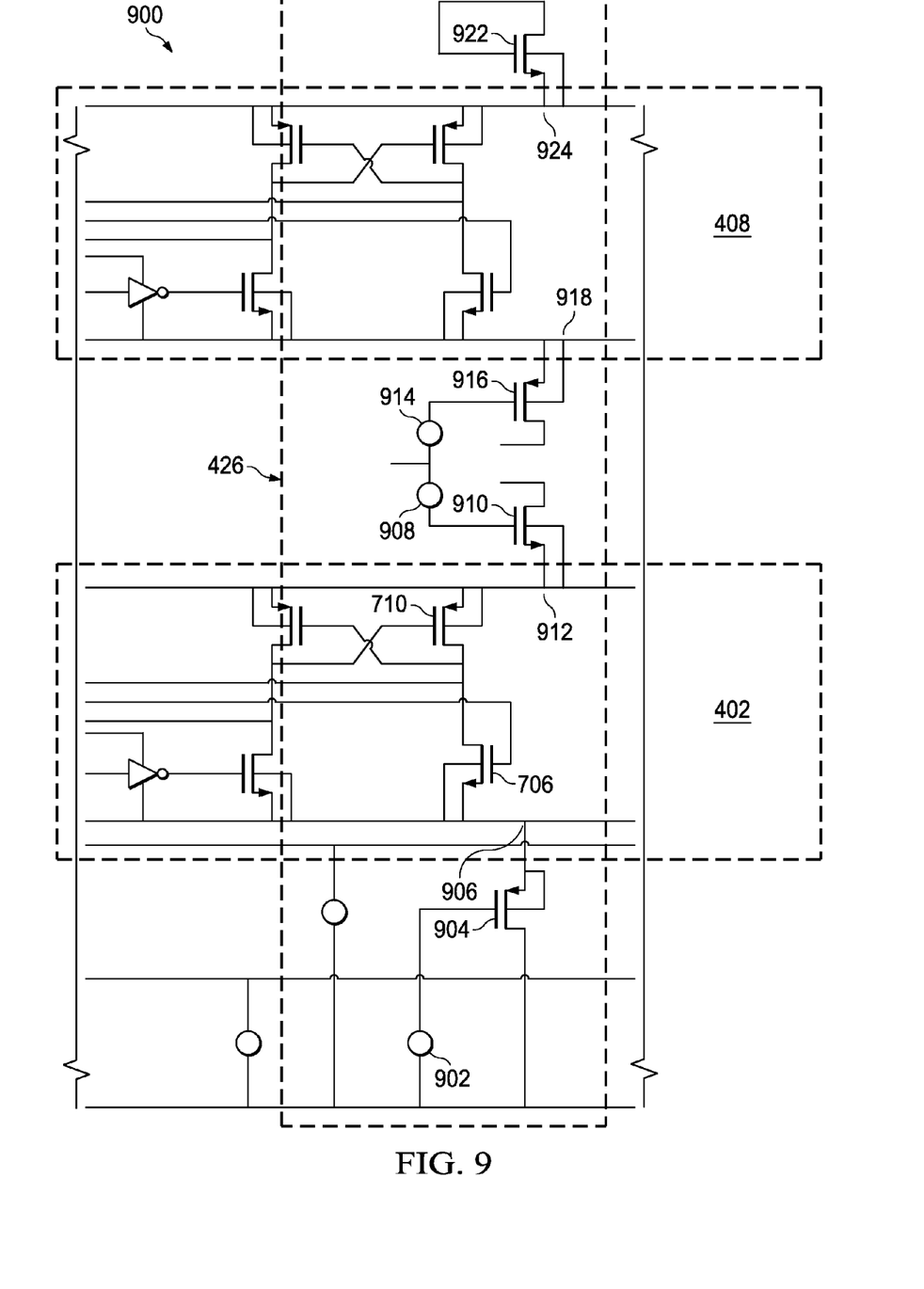
FIG. 9 illustrates the portion of FIG. 5 which represents the voltage reference functions.

The primary drive signal path through input buffer 428 serving driver 406 and output buffer 404 of pre-driver 402 has now been explained down to the component level and the following description will cover the voltage references to the same level using FIG. 9.

FIG. 9 shows diagram 900 which illustrates the components of voltage source component 426 of FIG. 4 and FIG. 5.

As shown in the figure, voltage source component 426 of diagram 900 includes a voltage source 902, a transistor 904, a voltage source 908, a transistor 910, a voltage source 914, a transistor 916, a voltage source 920 and a transistor 922.

A voltage rail 906 is arranged as the lower voltage rail of pre-driver 402 of FIG. 4 and FIG. 5 and a voltage rail 912 is arranged as the upper voltage rail of pre-driver 402 of FIG. 4 and FIG. 5. These lower and upper voltage rails are also shared by pre-driver 420.

A voltage rail 918 is arranged as the lower voltage rail of pre-driver 408 of FIG. 4 and FIG. 5 and a voltage rail 924 is arranged as the upper voltage rail of pre-driver 408 of FIG. 4 and FIG. 5. These lower and upper voltage rails are also shared by pre-driver 414.

Voltage source 902 and transistor 904 form an FET source follower based voltage reference source for pre-driver 402 and pre-driver 420. The voltage reference is applied to voltage rail 906 as shown in the figure and thus sets the lower voltage reference for pre-driver 402 and pre-driver 420. Similarly, voltage source 908 and transistor 910 form another FET source follower based voltage reference source for pre-driver 402 and pre-driver 420. This voltage reference is applied to voltage rail 912 as shown in the figure and thus sets the upper voltage reference for pre-driver 402 and pre-driver 420.

Voltage source 914 and transistor 916 form an FET source follower based voltage reference source for pre-driver 408 and pre-driver 414. The voltage reference is applied to voltage rail 918 as shown in the figure and thus sets the lower voltage reference for pre-driver 408 and pre-driver 414. Voltage source 920 and transistor 922 form another FET source follower based voltage reference source for pre-driver 408 and pre-driver 414. This voltage reference is applied to voltage rail 924 as shown in the figure and thus sets the upper voltage reference for pre-driver 402 and pre-driver 420.

Referring back to FIG. 3 briefly, it can be noted that voltage source 902 and transistor 904 correspond to voltage reference 334 and PMOS FET 336. Similarly, voltage source 908 and transistor 910 correspond to voltage reference 328 and PMOS FET 330, voltage source 914 and transistor 916 correspond to voltage reference 316 and PMOS FET 318 and voltage source 920 and transistor 922 correspond to voltage reference 310 and PMOS FET 312.

Having explained in detail pre-driver operation down to the component level, section by section, using FIGS. 6-9 overall pre-driver operation can be summarized by referring back to FIG. 5. FIG. 5 illustrates four identical pre-driver circuits, pre-drivers 402, 408, 414 and 420. For the purpose of brevity, pre-driver 402 only will be referenced. The data signal input to pre-driver 402 is first buffered by a 3-stage transistor cascode as described with reference to FIG. 6 and after current mirroring is then passed to driver component 406. As described with reference to FIG. 7, the driver circuit first buffers then level shifts its input signal in order to convert that signal to digital logic levels operating between a floating power and ground. The digital logic levels are then passed to output buffer component 404, a six inverter buffer chain which as described for FIG. 8 increases the drive strength of the pre-driver so it can drive an H-bridge load which uses large transistors. As explained with reference to FIG. 9, source follower based voltage sources set the upper and lower rail voltages of buffer 402 and thus set the maximum voltage swing of its operation.

In the foregoing described example embodiment, pre-driver parameters such as voltage reference source values and signal drive strengths have fixed values. In order to cater to different applications and to different user specifications, these parameter values may be adjusted, but this flexibility can be applied only at the design stage. The final implementation will still be with fixed values. However, an even greater flexibility can be realized using embodiments of the present invention in which parameters are variable and settable in the final implementation itself. Some such embodiments may be used as a final product which can adapt to different applications and specifications. Others may be used as a vehicle for parameter "tuning" in order to test various values with a view, for example, to achieving the best performance before the final values become fixed in the implementation. Still others may be used in applications whereby the circuit parameters are adaptable in real time to real time changes in load.

One such embodiment will be described using FIG. 10.

Figure 10:
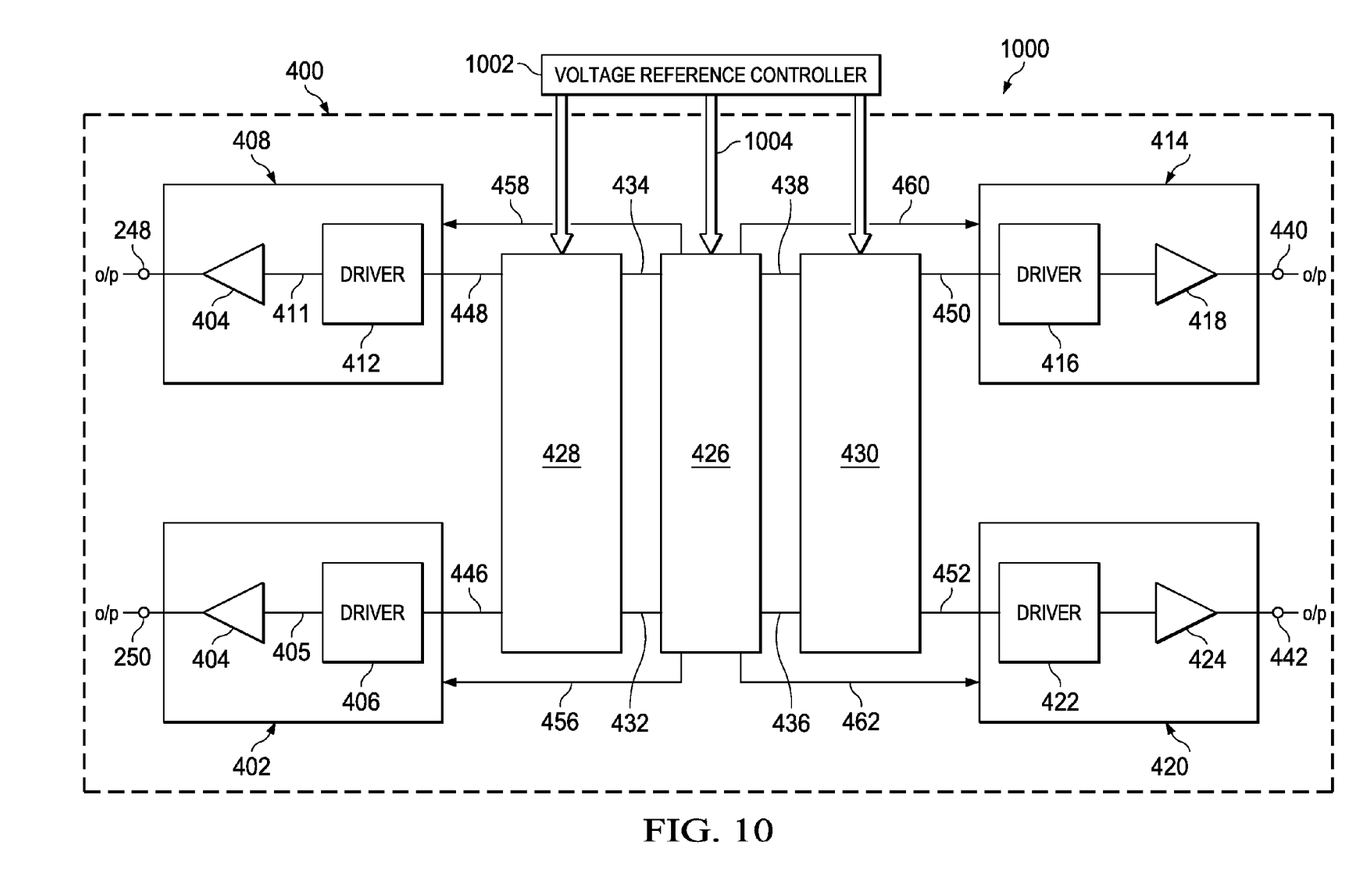
FIG. 10 is a component diagram of an embodiment that allows adjustment and setting of the voltage reference values.

FIG. 10 shows system 1000 an embodiment in which the voltage references are variable in the final product.

As shown in the figure, system 1000 includes circuit 400 and a voltage reference controller 1002. Voltage reference controller 1002 is arranged to communicate with voltage source component 426 via a control signal 1004.

In this embodiment, voltage reference controller 1002 provides adjustment and programmability of all four upper voltage references and all tour lower voltage references supplied by voltage source component 426 to pre-driver 402, pre-driver 408, pre-driver 414 and pre-driver 420. Voltage reference controller 1002 also provides adjustment and programmability of voltage references internal to input buffers 428 and 430. This allows the users of the pre-drivers the flexibility to adjust the pre-drivers for different applications and, within an application, to different user load requirements.

Non-limiting methods to achieve adjustability of the values by voltage reference controller 1002 may be by voltage reference controller 1002 supplying the voltages directly to the pre-drivers, or by voltage reference controller 1002 supplying an adjustment signal to a voltage source, such as an adjustable or programmable voltage regulator on hoard voltage source component 426.

The embodiment just described allows adjustment of voltage reference values. Using FIG. 11 another embodiment will now be described which extends the adjustment capability to pre-driver output buffer drive strength parameters.

Figure 11:
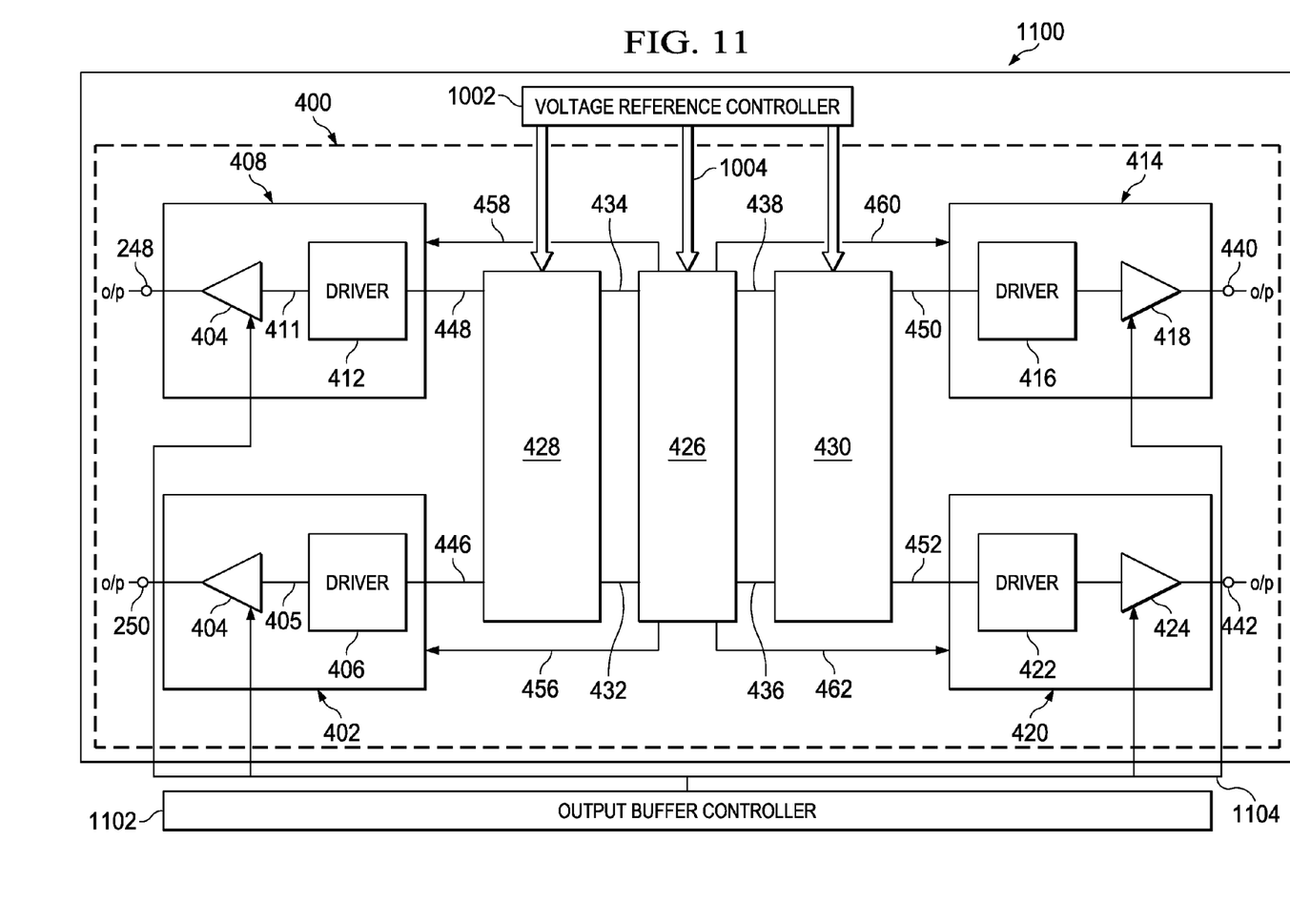
FIG. 11 is a component diagram of an embodiment that allows adjustment and setting of the pre-driver output buffer drive strength in additional to the voltage reference values.

FIG. 11 shows system 1100, an embodiment of the present invention in which both voltage reference values and output buffer drive strength is adjustable.

A shown in the figure, system 1100 includes circuit 400, voltage reference controller 1002 and buffer drive strength controller 1102. Buffer drive strength controller 1102 is arranged to control output buffer 404 of pre-driver 402, output buffer 410 of pre-driver 408, output buffer 418 of pre-driver 414 and output buffer 424 of pre-driver 420 via a control bus 1104.

In this embodiment, adjustability of the output buffer drive strength of each pre-drivers mentioned above is achieved using buffer drive strength controller 1102.

Each of output buffers 404, 410, 418 and 424 includes a plurality of CMOS inverters in a cascaded chain as described earlier for FIG. 8. One non-limiting method for buffer drive strength controller 1102 to achieve drive strength adjustability is for it to control the number of CMOS inverters in the buffer chain. In this way, the drive strength can be set to the load requirements while keeping the input capacitance as low as possible and the speed as fast as possible for the application.

It has been described in detail how the breakdown voltage limitations of CMOS technology for HDD driver and similar applications have been addressed through the use of aspects of the present invention, specifically an H-bridge design using cascoded CMOS FETs, and how the challenges which then arise through the use of cascoding CMOS transistors have also been overcome using aspects of the present invention which include the use of pre-drivers and source follower voltage sources. It has further been illustrated through the description of the initial embodiment and additional embodiments that the use of pre-drivers can also support tailoring and tuning of the major parameters of the present invention so that different applications and user specifications can be supported not only at the design stage but also in a final implementation.

While a DC motor application has been used to describe H-bridge transmitter operation, aspects of the present invention can be used in a variety of high voltage applications where an alternative technology with a higher breakdown voltage than CMOS, such as bipolar technology, has conventionally been used. A specific, non-limiting, example is as an HDD read/write head driver application whereby the driver can be implemented in the same technology as the CMOS logic used for the accompanying data circuits thus achieving gains in ease of fabrication and cost effectiveness.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A circuit comprising:
   a cascoded H-bridge arranged to provide a driving signal for driving a load;
   an upper voltage supply component operable to provide an upper supply voltage to said cascoded H-bridge;
   a lower voltage supply component operable to provide a lower supply voltage to said cascoded H-bridge; and
   a pre-driver component operable to provide a pre-driving signal to said cascoded H-bridge, said pre-driver component having a first voltage source and a second voltage source, said first voltage source being operable to provide an upper swing voltage, said second voltage source being operable to provide a lower swing voltage,
   wherein said pre-driver component is operable to provide the pre-driving signal based on the upper swing voltage and the lower swing voltage;
   wherein said cascoded H-bridge comprises an upper field effect transistor, an upper cascode field effect transistor, a lower cascode field effect transistor and lower field effect transistor,
   wherein said pre-driver component is operable to provide the pre-driving signal to one of said upper field effect transistor, said upper cascode field effect transistor, said lower cascode field effect transistor and said lower field effect transistor;
   wherein said pre-driver component comprises an amplifying component operable to provide the pre-driving signal based on an amplification of said one of the first voltage source and the second voltage source;
   a controlling component operable to generate a control signal based on the pre-driving signal,
   wherein said amplifying component is operable to provide the pre-driving signal based on a controllable amplification of said one of the upper supply voltage and the lower supply voltage, and
   wherein said amplifying component is operable to control amplification of said one of the upper supply voltage and the lower supply voltage based on the control signal.

2. The circuit of claim 1, wherein said first voltage source is a controllable voltage source.

3. The circuit of claim 2,
   wherein said cascoded H-bridge comprises an upper field effect transistor, an upper cascode field effect transistor, a lower cascode field effect transistor and lower field effect transistor, and
   wherein said pre-driver component is operable to provide the pre-driving signal to one of said upper field effect transistor, said upper cascode field effect transistor, said lower cascode field effect transistor and said lower field effect transistor.

4. A circuit comprising:
   a cascoded H-bridge arranged to provide a driving signal for driving a load;
   an upper voltage supply component operable to provide an upper supply voltage to said cascoded H-bridge;
   a lower voltage supply component operable to provide a lower supply voltage to said cascoded H-bridge; and
   a pre-driver component operable to provide a pre-driving signal to said cascoded H-bridge, said pre-driver component having a first voltage source and a second voltage source, said first voltage source being operable to provide an upper swing voltage, said second voltage source being operable to provide a lower swing voltage,
   wherein said pre-driver component is operable to provide the pre-driving signal based on the upper swing voltage and the lower swing voltage; and
   a controlling component operable to generate a control signal based on the pre-driving signal,
   wherein said first voltage source is operable to change the upper swing voltage based on the control signal.

* * * * *